(12) United States Patent
Tamaya et al.

(10) Patent No.: US 8,233,512 B2
(45) Date of Patent: Jul. 31, 2012

(54) LASER LIGHT SOURCE MODULE

(75) Inventors: Motoaki Tamaya, Chiyoda-ku (JP);
Keiichi Fukuda, Chiyoda-ku (JP);
Shinichi Oe, Chiyoda-ku (JP); Chise Nanba, Chiyoda-ku (JP); Akira Nakamura, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 30 days.

(21) Appl. No.: 12/740,055

(22) PCT Filed: Dec. 21, 2007

(86) PCT No.: PCT/JP2007/074689
§ 371 (c)(1),
(2), (4) Date: Apr. 27, 2010

(87) PCT Pub. No.: WO2009/081470
PCT Pub. Date: Jul. 2, 2009

(65) Prior Publication Data
US 2010/0260226 A1    Oct. 14, 2010

(51) Int. Cl.
*H01S 3/04* (2006.01)
(52) U.S. Cl. .................. 372/36; 372/34; 372/50.12
(58) Field of Classification Search .................. 372/34, 372/36, 50.12
See application file for complete search history.

(56) References Cited

U.S. PATENT DOCUMENTS

| | | | |
|---|---|---|---|
| 6,072,815 A | 6/2000 | Peterson | |
| 6,387,286 B1 | 5/2002 | Takigawa et al. | |
| 6,528,825 B2 | 3/2003 | Yoshida | |
| 2002/0100914 A1 | 8/2002 | Yoshida | |
| 2003/0016710 A1* | 1/2003 | Komoto | 372/36 |
| 2006/0104565 A1 | 5/2006 | Shimada et al. | |
| 2006/0176918 A1* | 8/2006 | Aruga | 372/38.1 |

FOREIGN PATENT DOCUMENTS

| | | |
|---|---|---|
| JP | 61-202484 A | 9/1986 |
| JP | 7-273133 A | 10/1995 |
| JP | 11-330627 A | 11/1999 |

(Continued)

OTHER PUBLICATIONS

International Search Report for PCT/JP2007/074689 completed Jan. 9, 2008.

(Continued)

*Primary Examiner* — Yuanda Zhang
(74) *Attorney, Agent, or Firm* — Buchanan Ingersoll & Rooney PC

(57) ABSTRACT

A heat sink is made of a material excellent in thermal conductivity and is mounted on a stem; a sub-mount substrate is made of a material excellent in insulation property and is mounted on the heat sink; a first lead frame made of a material excellent in electric conductivity and thermal conductivity and having a linear expansion coefficient similar to that of a semiconductor laser array, is mounted on the sub-mount substrate, having the semiconductor laser array mounted thereon, and composing a power feeding path of the semiconductor laser array; a second lead frame made of a material excellent in electric conductivity and thermal conductivity, is arranged on the sub-mount substrate side by side with the first lead frame, and composing the power feeding path of the semiconductor laser array; and a wire electrically bonds the semiconductor laser array and the second lead frame.

4 Claims, 5 Drawing Sheets

FOREIGN PATENT DOCUMENTS

| | | |
|---|---|---|
| JP | 2001-345507 A | 12/2001 |
| JP | 2002-84027 A | 3/2002 |
| JP | 2002-359335 A | 12/2002 |
| JP | 2003-60282 A | 2/2003 |
| JP | 2004-356249 A | 12/2004 |
| JP | 2006-128236 A | 5/2006 |
| JP | 3816194 B2 | 8/2006 |
| JP | 2007-221109 A | 8/2007 |

OTHER PUBLICATIONS

Written Opinion for PCT/JP2007/074689 completed Jan. 9, 2008.

* cited by examiner

LASER LIGHT SOURCE MODULE

TECHNICAL FIELD

The invention relates to a laser light source module on which a semiconductor laser array obtained by arranging a plurality of semiconductor laser elements in an array pattern is mounted, and especially relates to reduction in power consumption of the module and reduction in stress loaded on the laser elements.

BACKGROUND ART

The above-described laser light source module is composed of a semiconductor laser array obtained by arranging a plurality of semiconductor laser elements in a direction orthogonal to a light axis of a laser beam, a sub-mount substrate made of an insulating material and on which a power feeding circuit pattern is formed, a heat sink made of a material having high thermal conductivity such as copper, and a stem on which a plurality of power feeding lead pins are side-by-side arranged in a standing manner. Meanwhile, the semiconductor laser array is mounted on the sub-mount substrate, the sub-mount substrate is mounted on the heat sink, and the heat sink is mounted on the stem. Then, by electrically bonding the lead pin and the sub-mount substrate, and the sub-mount substrate and the array semiconductor laser element by a method such as wire bonding or solder bonding and applying current to the lead pin, the semiconductor laser array may be driven to output laser light.

Stress is loaded on the laser element when this is driven and temperature thereof increases, due to difference in linear expansion coefficient between the same and the sub-mount substrate on which this is mounted. In a case of an array semiconductor laser element, dimension of the element is larger than that of a single laser element, and the stress acting on each laser element also is relatively large. Also, since an oscillation wavelength is changed according to the temperature in the laser element and the reliability thereof lowers at high temperature, it is desirable that the temperature in the semiconductor laser array is made uniform as far as possible at an appropriate temperature.

For the reason described above, it is conventionally proposed to use the material such as copper tungsten (hereinafter, CuW) excellent in thermal conductivity and having the linear expansion coefficient similar to that of the semiconductor laser array as the material of a heat sink member on which the semiconductor laser array or the sub-mount substrate is mounted. For example, the Patent Documents 1 and 2 propose a structure in which a plate member made of CuW is interposed between the semiconductor laser array and a water-cooling device.

Also, the Patent Document 3 proposes a structure in which the sub-mount material is CuW and the plate member made of copper (hereinafter, Cu), which becomes an insulating substrate and a power feeding path, and the semiconductor laser array are mounted on the sub-mount, and an electrode and the power feeding path of the semiconductor laser array are electrically bonded by means of wire bonding. In the laser light source module having such a structure, the power consumption and an amount of heat generation of the power feeding path may be made small even when large current is applied by using the CuW sub-mount and the Cu plate member of which electric resistance is small as the power feeding path.

Patent Document 1: Specification of Japanese Patent No. 3816194
Patent Document 2: Japanese Patent Application Laid-Open Publication No. 2007-221109
Patent Document 3: Japanese Patent Application Laid-Open No. 2006-128236

DISCLOSURE OF INVENTION

Problem to be Solved by the Invention

However, as proposed in the above-described Patent Documents 1 and 2, when forming the power feeding path on the sub-mount made of the insulating material by a circuit pattern formed by a method such as vapor deposition and plating and arranging the heat sink made of CuW and the like below the sub-mount, although the stress loaded on the semiconductor laser array is reduced, the amount of heat generation in the power feeding path becomes large. Therefore, measures for making cooling ability of the module larger are required. Also, since the power consumption in the power feeding path becomes large, there is a problem that the power consumption of the module becomes large.

On the other hand, as disclosed in the Patent Document 3, when the sub-mount material is CuW and the insulating plate and the Cu plate are stacked and mounted on the sub-mount and the semiconductor laser array is mounted in parallel to them, a thickness of the semiconductor laser array is generally approximately 0.1 mm, and plate thickness of the insulating plate material made of aluminum nitride (hereinafter, AlN) and silicon carbide (hereinafter, SiC) is approximately 0.1 to 1.0 mm, so that when they are mounted on the plate material made of CuW, a height of an upper surface of the insulating plate is higher than the height of an upper surface of the semiconductor laser array, and when mounting by a general purpose head of a die bonder, the semiconductor laser array cannot be mounted finally by head interference, and as a result, there is a problem that solder to bond the semiconductor laser array is melted by heating when mounting the insulating plate and the Cu plate and a mounting position of the semiconductor laser array is misaligned occurs.

Also, in the laser light source module of which mounting area is small and is mounted on a CAN package suitable for high accuracy and high output application, further smaller footprint than that mounted on a butterfly package is required.

The invention is made for solving the above-described problem, and an object thereof is to provide the laser light source module capable of realizing reduction of stress loaded on the semiconductor laser array and reduction of the amount of heat generation with a small footprint and suitable for being mounted on the CAN package, for example.

Means for Solving Problem

In order to attain the above object, a laser light source module of the present invention having a semiconductor laser array obtained by arranging a plurality of semiconductor laser elements in an array pattern mounted thereon includes a stem, a plurality of power feeding lead pins arranged in a standing manner on the stem, a heat sink made of a material excellent in thermal conductivity and is mounted on the stem, a sub-mount substrate made of a material excellent in insulation property and is mounted on the heat sink, a first lead frame made of a material excellent in electric conductivity and thermal conductivity and having a linear expansion coefficient similar to the linear expansion coefficient of the semiconductor laser array, mounted on the sub-mount substrate, having the semiconductor laser array mounted thereon, composing a power feeding path of the semiconductor laser array, and electrically bonded to the power feeding lead pins, a second lead frame made of a material excellent in electric conductivity and thermal conductivity, arranged on the sub-mount substrate side by side with the first lead frame, composing the power feeding path of the semiconductor laser array, and electrically bonded to other power feeding lead pins, and a wire for electrically bonding the semiconductor laser array and the second lead frame.

Effect of the Invention

According to the laser light source module according to the invention, by mounting the first lead frame formed of the material excellent in electric conductivity and thermal conductivity and having the linear expansion coefficient similar to that of the semiconductor laser array and the second lead frame made of the material excellent in electric conductivity side by side on the sub-mount substrate made of the material excellent in insulation property and further by mounting the semiconductor laser array on the first lead frame to use the first lead frame and the second lead frame as the power feeding paths, an effect of reducing the stress loaded on the semiconductor laser array due to difference between the linear expansion coefficients of the semiconductor laser array and the sub-mount substrate associated with the increase in module temperature, an effect of reducing the power consumption generated in the power feeding path as compared to a case of the circuit pattern vapor-deposited on the sub-mount substrate, and an effect of uniformizing the heat amount generated in the semiconductor laser array 7 may be simultaneously realized.

Figure 1:
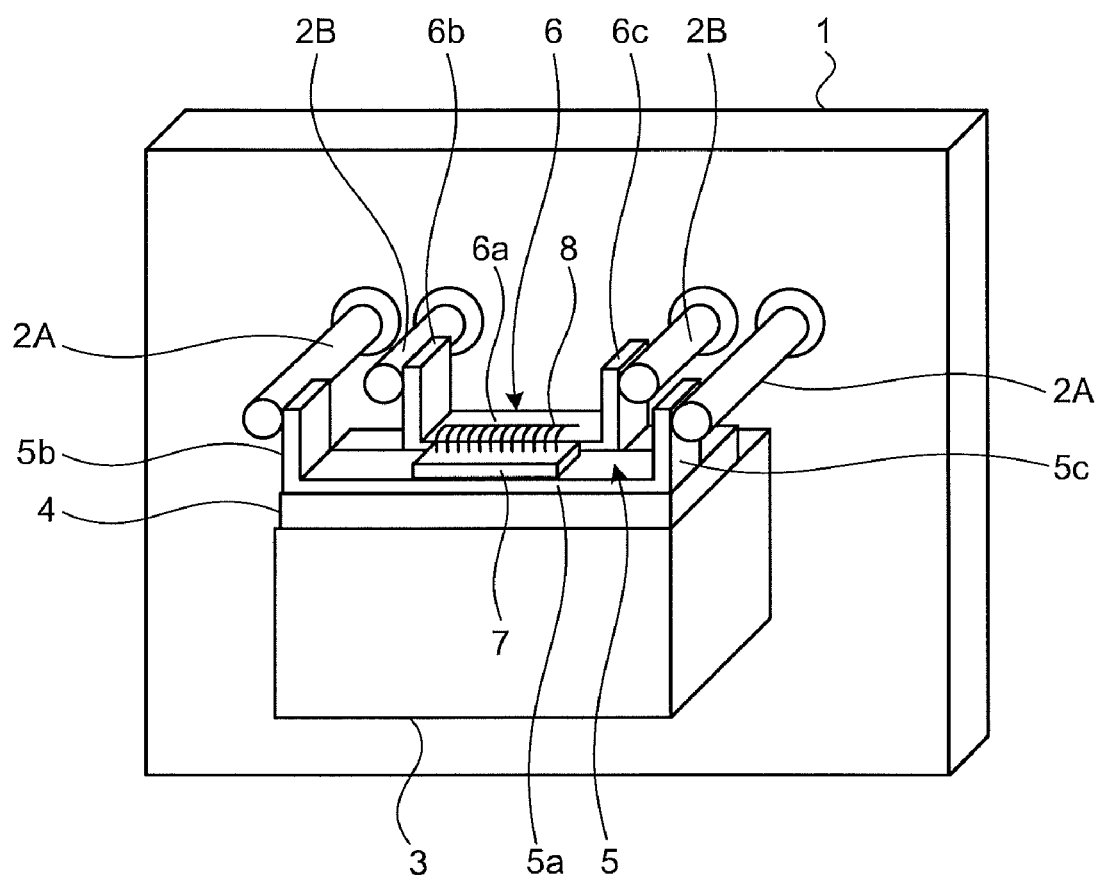
FIG. 1 is a perspective view of a first embodiment of a laser light source module according to the invention.

EXPLANATIONS OF LETTERS OR NUMERALS 1 stem
2A, 2B power feeding lead pin
3 heat sink
4 sub-mount substrate
5, 5B first lead frame
6, 6B second lead frame
7 semiconductor laser array
8 wire
9 ribbon
11 die bonder head
100, 101 laser light source module

BEST MODE(S) FOR CARRYING OUT THE INVENTION

Hereinafter, embodiments of a laser light source module according to the invention are described in detail with reference to drawings. Meanwhile, the invention is not limited by the embodiments.

First Embodiment

FIG. 1 is a perspective view of a first embodiment of the laser light source module according to the invention. In FIG. 1, a laser light source module 100 of the embodiment has a stem 1, two pairs of power feeding lead pins 2A, 2A and 2B, 2B arranged in a standing manner on the stem 1, a heat sink 3 made of a material excellent in heat conductivity and mounted on the stem 1, and a sub-mount substrate 4 made of a material excellent in insulation property and mounted on the heat sink 3.

Further, the laser light source module 100 further has a first lead frame 5 mounted on the sub-mount substrate 4 and having a semiconductor laser array 7 mounted on an upper surface thereof to which any one of positive and negative electrodes of the semiconductor laser array 7 is connected, a second lead frame 6 arranged on the sub-mount substrate 4 side by side with the first lead frame 5 to which the other electrode of the semiconductor laser array 7 is connected, and a wire 8 for electrically bonding the semiconductor laser array 7 and the second lead frame 6. The first lead frame 5 is made of a material excellent in electric conductivity and thermal conductivity having a linear expansion coefficient comparable to that of the semiconductor laser array 7, and has the semiconductor laser array 7 mounted thereon and composes a power feeding path of the semiconductor laser array 7. The second lead frame 6 is made of a material excellent in electric conductivity and thermal conductivity, and composes the power feeding path of the semiconductor laser array 7.

The stem 1 is a plate-shaped member formed of a metal material to which the power feeding lead pins 2A, 2A and 2B, 2B, which are power feeding lines to the semiconductor laser array 7, are fixed by glass sealing. Also, the heat sink 3 is mounted on the stem 1 so as to be fixed thereto by a method such as soldering. The sub-mount substrate 4 made of a material excellent in insulation property such as AlN and SiC and having an electric circuit pattern formed on an upper surface thereof is mounted on an upper surface of the heat sink 3 so as to be fixed thereto by the method such as soldering.

The first lead frame 5 and the second lead frame 6 are mounted on the circuit pattern formed on the sub-mount substrate 4. The first lead frame 5 is made of a material such as CuW of which linear expansion coefficient is similar to that of gallium arsenide (hereinafter, GaAs), which is a material of the semiconductor laser array 7, thermal conductivity is high and electric resistance is small. The first lead frame 5 has a shape obtained by bending a planar plate into a U-shape and is composed of a planar main portion 5a of which main surface is fixed to the sub-mount substrate 4 and bent portions 5b and 5c arranged in a standing manner so as to be bent at a right angle from both ends of the main portion 5a. In the first lead frame 5, the bent portions 5b and 5c are electrically and mechanically bonded to the power feeding lead pins 2A and 2A, respectively, by the method such as soldering.

The second lead frame 6 is formed of a material such as Cu of which heat conductivity is high and electric resistance is small, and has a shape obtained by bending a planar plate into a U-shape and is composed of a planar main portion 6a of which main surface is fixed to the sub-mount substrate 4 and bent portions 6b and 6c arranged in a standing manner so as to be bent at a right angle from both ends of the main portion 6a, as in the case of the first lead frame 5. In the second lead frame 6, the bent portions 6b and 6c are electrically and mechanically bonded to the power feeding lead pins 2B and 2B, respectively, by the method such as soldering.

The semiconductor laser array 7 has a structure in which a plurality of semiconductor laser elements are arranged in parallel and has electrodes on upper and lower surfaces thereof. A lower surface electrode of the semiconductor laser array 7 is electrically and mechanically connected to the first lead frame 5 by the method such as soldering such that a light emitting direction thereof is opposite to a direction of the stem 1. On the other hand, an upper surface electrode of the semiconductor laser array 7 is electrically connected to the second lead frame 6 by a method such as wire bonding using the wire 8 made of a material such as gold (hereinafter, Au).

Meanwhile, plate thicknesses of the first lead frame 5 and the second lead frame 6 are selected so as to satisfy a following equation.

$a > b < a+c$, wherein a: plate thickness of the first lead frame 5,
b: plate thickness of the second lead frame 6, and
c: plate thickness of the semiconductor laser array 7.

Next, operation is described. An example in which the semiconductor laser array 7 is mounted in a junction (anode)-down configuration is described. Meanwhile, even when this is mounted in a junction-up configuration, the configuration and effect are not changed except that a power feeding route is reversed.

When the semiconductor laser array 7 is mounted in the junction-down configuration, by applying current through the power feeding route starting from the lead pin 2A to pass through the first lead frame 5, the semiconductor laser array 7, the wire 8 and the second lead frame 6 to reach the lead pin 2B, the current flows through the semiconductor laser array 7 and laser light is oscillated and emitted.

Figure 2:
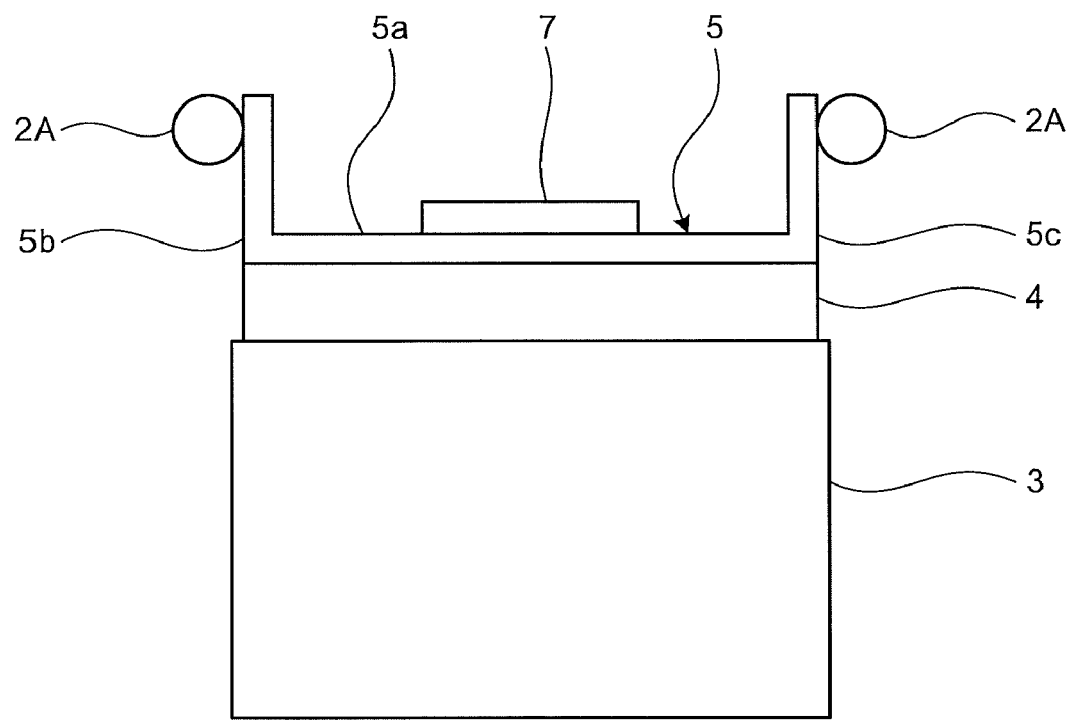
FIG. 2 is a front view of a substantial part of the laser light source module of the first embodiment.

FIG. 2 is a front view of a substantial part of the laser light source module 100 of the embodiment. In FIG. 2, the second lead frame 6 and the lead pin 2B are not shown. When the current is loaded on the laser light source module 100 to drive the same, energy other than that emitted to outside as the laser light is consumed as heat, and the semiconductor laser array 7 produces heat. Also, each of the components other than the semiconductor laser array 7 included in the above-described power feeding route produces heat according to an electric resistance value and a current value thereof. As a result, as for the components in the power feeding route especially, temperature is higher than that before the power feeding.

Herein, the semiconductor laser array 7, the first lead frame 5, the sub-mount substrate 4 and the heat sink 3 are made of GaAs, CuW, AlN and Cu, respectively, as main components. The linear expansion coefficients of the materials are different from one another such as $\alpha = 6.63 \times 10^{-6}$ [mm/mm] for GaAs, $\beta = 6.5 \times 10^{-6}$ [m/mm] for CuW, and $\rho = 4.8 \times 10^{-6}$ [m/mm] for AlN. As a result, the semiconductor laser array 7, the first lead frame 5 and the sub-mount substrate 4 tend to expand or contract due to temperature fluctuation.

In the embodiment, since the semiconductor laser array 7 is bonded on the first lead frame 5, when focusing on a bonding part of them, the semiconductor laser array 7 and the first lead frame 5 tend to relatively move (expand) by a following amount relative to a length L of the bonding part.

Expansion amount of the semiconductor laser array 7 $\Delta X = \alpha \times \Delta T \times L$ Expansion amount of the first lead frame 5 $\Delta Y = \beta \times \Delta T \times L$ At that time, there is a difference $\Delta Y - \Delta X$ according to the linear expansion coefficients of the materials between the expansion amounts of the semiconductor laser array 7 and the first lead frame 5, so that shear stress is generated in the material bonding part and tension stress or compression stress is loaded also on the material itself. When high stress is loaded on the semiconductor laser, a phenomenon that transition is generated in the semiconductor laser substrate at the time of operation and develops to achieve an active layer, thereby reducing an output (Dark Line Defect (DLD)) occurs, and a phenomenon that the semiconductor laser substrate breaks due to development of crack and the like occurs.

Meanwhile, in the conventional laser light source module, which is not according to the embodiment, the semiconductor laser array is directly bonded on the sub-mount substrate, so that when the expansion amount of the sub-mount substrate is set to $\Delta Z$, a difference between the linear expansion coefficient of AlN, which is the component of the sub-mount substrate, and the linear expansion coefficient of GaAs, which is the component of the semiconductor laser array 7, is larger than that between CuW and GaAs. As a result, since a difference $\Delta Z - \Delta X$ between the expansion amounts when the temperature fluctuation occurs also becomes large, in the laser light source module 100 of the embodiment, the stress to be loaded becomes smaller than in the case of the conventional semiconductor laser array, and the DLD and the crack development hardly occur, so that reliability is improved.

Figure 3:
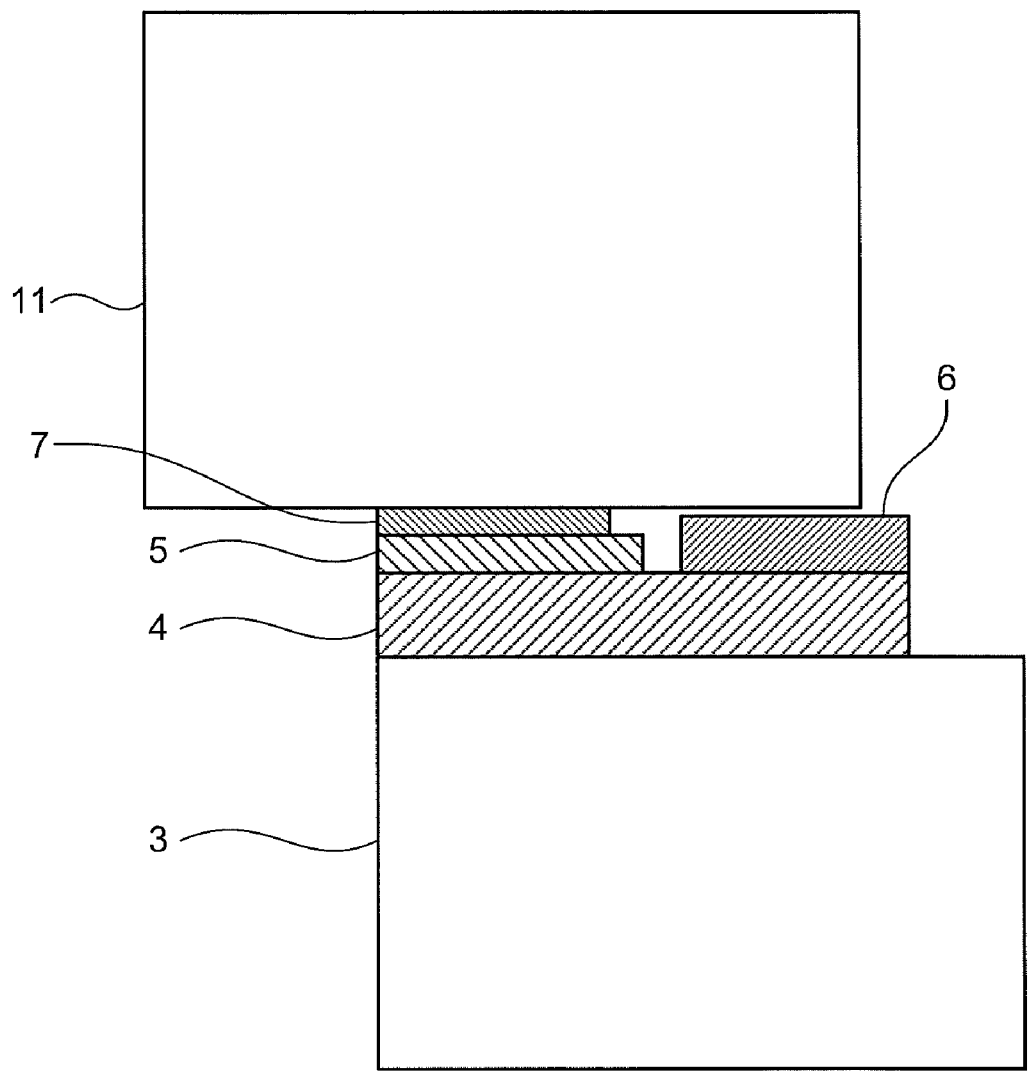
FIG. 3 is a partially sectional side view of a bonding state of the laser light source module of the first embodiment seen from a side.

FIG. 3 is a partially sectional schematic diagram showing a state of bonding of the laser light source module 100 of the embodiment seen from a side thereof. The semiconductor laser array 7 is electrically and mechanically bonded on the first lead frame 5 by means of soldering and the like. Also, the first lead frame 5 and the second lead frame 6 are mechanically bonded on the sub-mount substrate 4 by means of soldering and the like. Herein, the bonding of the devices is generally carried out by operation such as handling and heating of the works and supplying of solder and the like, which is a die bonding material, by a device referred to as a die bonder. When a general purpose head is used for heating and pressurizing the works, since an outer shape of a bonding head 11 is larger than a chip size, the head interferes with an object as high as or higher than the work to be mounted in the vicinity of the periphery.

In the embodiment, as described above, when the plate thickness of the first lead frame 5, the plate thickness of the second lead frame 6 and the plate thickness of the semiconductor laser array 7 are set to a, b and c, respectively, $a < b < a+c$ is satisfied, so that by mounting the first lead frame 5, the second lead frame 6 and the semiconductor laser array 7 in this order, the first lead frame 5, the second lead frame 6 and the semiconductor laser array 7 may be mounted without interference between the bonding head 11 and the work, even when using the general purpose head. Also, since the semiconductor laser array 7 may be mounted finally, solder melt due to heating at the time of mounting and misalignment of mounting position associated with the same do not occur, so that mounting accuracy of the semiconductor laser array 7 may be improved.

Figure 4:
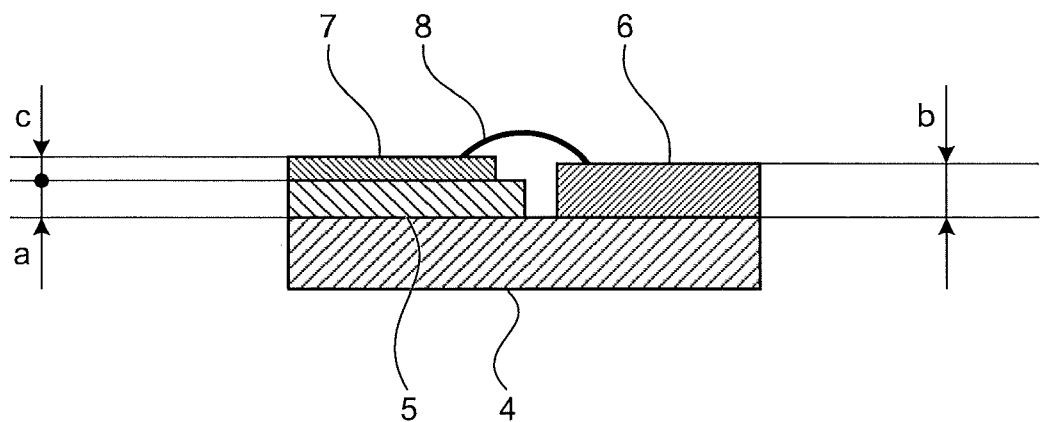
FIG. 4 is a cross-sectional view of a substantial part for illustrating relationship in thickness between each member of the laser light source module of the first embodiment.

FIG. 4 is a cross-sectional view of a substantial part seen from a side thereof for illustrating relationship among the thicknesses of members of the laser light source module 100 of the embodiment. In the embodiment, since the first lead frame 5 and the second lead frame 6 are mounted on the sub-mount substrate 4 as the power feeding paths and the semiconductor laser array 7 is mounted on the first lead frame 5, positions in height of the upper surface (electrode surface) of the semiconductor laser array 7 and the upper surface of the second lead frame 6 may be made substantially equal to each other, so that a length of the wire 8 may be made shorter, and as a result, power consumption in the wire 8 portion when the current is loaded on the laser light source module 100 may be made smaller.

As described above, according to the laser light source module 100 of the embodiment, by mounting the first lead frame 5 formed of the material such as CuW excellent in electric conductivity and thermal conductivity and having the linear expansion coefficient similar to that of the semiconductor laser array 7 and the second lead frame 6 made of the material such as Cu excellent in electric conductivity side by side on the sub-mount substrate 4 formed of the material excellent in insulation property and by further mounting the semiconductor laser array 7 on the first lead frame 5 to use the first lead frame 5 and the second lead frame 6 as the power feeding paths, an effect of reducing the stress loaded on the semiconductor laser array 7 due to the difference between linear expansion coefficients of the semiconductor laser array 7 and the sub-mount substrate 4 in association with increase in module temperature, an effect of reducing the power consumption generated in the power feeding path as compared to a case of a circuit pattern vapor-deposited on the sub-mount substrate 4, and an effect of uniformizing heat quantity generated in the semiconductor laser array 7 are realized simultaneously.

Also, since the first lead frame 5 and the second lead frame 6 are used as the power feeding paths, a cross sectional area of the power feeding path is larger than that formed of the circuit pattern formed by a method such as general vapor deposition and plating. That is to say, this is the power feeding path of which electric resistance is small, so that the power consumption and an amount of heat generation in the power feeding path may be made small even when supplying large current. Also, since the first lead frame 5 on which the semiconductor laser array 7 is mounted is formed of the material such as CuW of which linear expansion coefficient is similar to that of the semiconductor laser array 7, the stress value loaded on the semiconductor laser array 7 may be reduced. At the same time, since the first lead frame 5 is the material of which thermal conductivity is high, the heat generated from the semiconductor laser array 7 may be diffused and a thermal distribution may be uniformized, so that a stabilized output in which variation in oscillation wavelength and oscillation efficiency is eliminated may be obtained in each emitter of the semiconductor laser array 7.

Since the plate thickness a of the first lead frame 5, the plate thickness b of the second lead frame 6 and the substrate thickness c of the semiconductor laser array 7 are selected such that the equation a<b<a+c is satisfied, when the first lead frame 5, the second lead frame 6 and the semiconductor laser array 7 are mounted in this order using the general purpose bonder, a pickup tool of the bonder does not interfere with another member already mounted, so that the mounting of the members becomes easy. Also, since the semiconductor laser array 7 may be mounted finally, the mounting position of the semiconductor laser array 7 is not misaligned due to heating after the mounting of the semiconductor laser array 7, and one-time heating is enough, so that the reliability of the semiconductor laser array 7 is improved.

Also, since the second lead frame 6 is provided, the difference in position in height of the upper surface electrode of the semiconductor laser array 7 and the upper surface of the second lead frame 6 may be made smaller than in a case in which there is no second lead frame 6 by making the relationship of the plate thicknesses b≈a+c. According to this, when electrically connecting the upper surface electrode of the semiconductor laser array 7 and the upper surface of the second lead frame 6 by means of wire bonding, the length of the wire may be made shorter due to the small difference in position in height, and the electric resistance value may be made smaller, and as a result, the power consumption may be made smaller.

Meanwhile, although the first lead frame 5 and the second lead frame 6 form the U-shape because the position of the lead pin 2 is above the semiconductor laser array 7 in the embodiment, it is also possible that the lead pin position is in a direction of the side surface of the semiconductor laser array 7 and the lead frame is used by being fabricated into a shape other than the U-shape or used in the planar shape without being fabricated.

Second Embodiment

Figure 5:
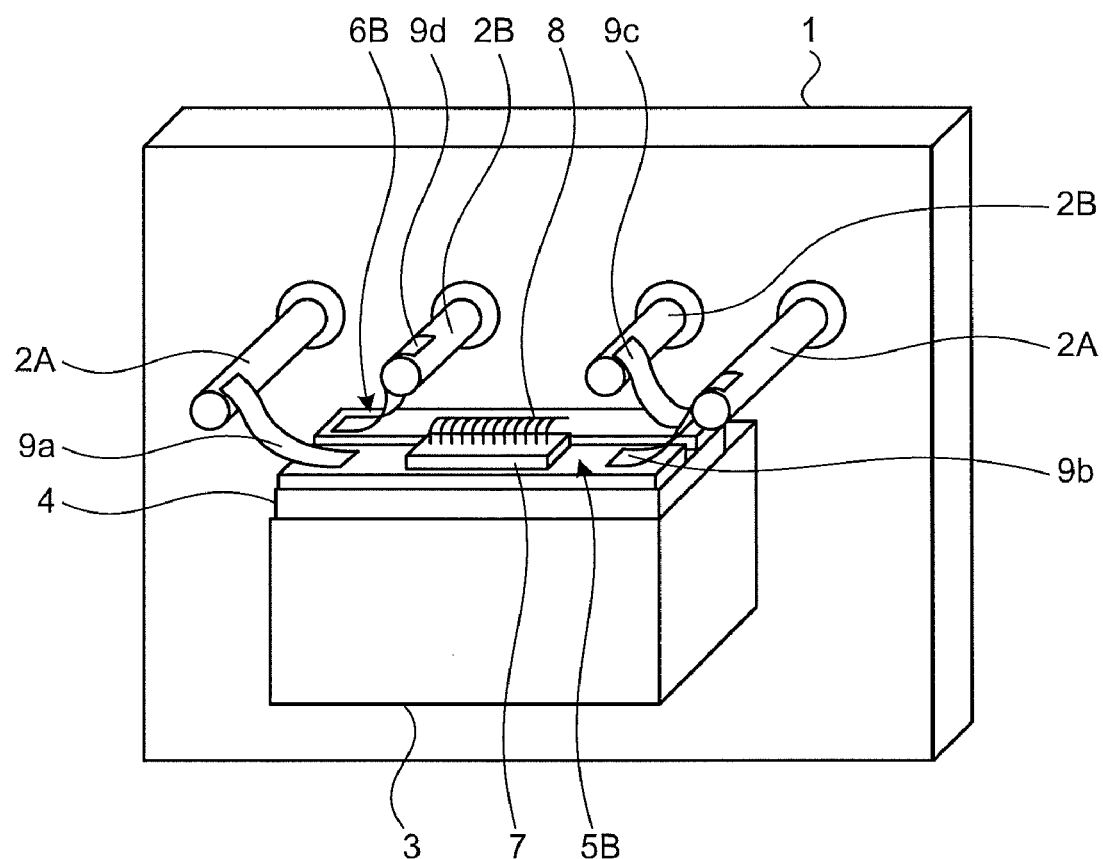
FIG. 5 is a perspective view of a second embodiment of the laser light source module according to the invention.

FIG. 5 is a perspective view of a second embodiment of the laser light source module according to the invention. In FIG. 5, in a laser light source module 101 of the embodiment, a first lead frame 5B and a second lead frame 6B are not in the U-shape but in the planar shape. Also, the first lead frame 5B and the second lead frame 6B are electrically bonded to the lead pins 2 by ribbons 9a, 9b, 9c and 9d. Other configuration is identical to that of the first embodiment, and description of the configuration to which the same reference numeral is given is omitted.

Next, the operation is described. However, only the operation different from that of the first embodiment is described and the similar operation is not described. When the semiconductor laser array 7 is mounted in the junction-down configuration, by applying the current through the power feeding route starting from the lead pin 2A to pass through the ribbons 9a and 9b, the first lead frame 5B, the semiconductor laser array 7, the wire 8, the second lead frame 6B and the ribbon 9 to reach the lead pin 2B, the current passes through the semiconductor laser array 7 and the laser light is oscillated and emitted.

In the embodiment, when bonding the first lead frame 5B and the second lead frame 6B to the lead pins 2 by the ribbon 9 and the like, they may be electrically bonded regardless of the mounting accuracy of the first lead frame 5B and the second lead frame 6B. Therefore, the productivity is improved.

Meanwhile, the configuration described in the first embodiment and the configuration described in the second embodiment may be combined in two power feeding paths to be applied.

INDUSTRIAL APPLICABILITY

As described above, the laser light source module according to the invention is useful to be applied to the laser light source module, which is required to have a small footprint, and is especially preferable to be applied to the laser light source module mounted on a CAN package.

The invention claimed is:

1. A laser light source module having a semiconductor laser array obtained by arranging a plurality of semiconductor laser elements in an array pattern mounted thereon, comprising:
   a stem;
   a plurality of power feeding lead pins arranged in a standing manner on the stem;

a heat sink made of a thermally conductive material mounted on the stem;

a sub-mount substrate made of an insulative material mounted on the heat sink;

a first lead frame made of an electrically conductive and thermally conductive material and having a linear expansion coefficient similar to the linear expansion coefficient of the semiconductor laser array, mounted on the sub-mount substrate, having the semiconductor laser array mounted thereon, composing a power feeding path of the semiconductor laser array, and electrically bonded to the power feeding lead pins;

a second lead frame made of an electrically conductive and thermally conductive material arranged on the sub-mount substrate side by side with the first lead frame, composing the power feeding path of the semiconductor laser array, and electrically bonded to other power feeding lead pins; and a wire for electrically bonding the semiconductor laser array and the second lead frame, wherein a relationship among a plate thickness a of the first lead frame, a plate thickness b of the second lead frame, and a plate thickness c of the semiconductor laser array satisfies $$a<b<a+c.$$

2. The laser light source module according to claim 1, wherein
the first lead frame and the second lead frame are directly bonded to the power feeding lead pins.

3. The laser light source module according to claim 1, wherein
the first lead frame and the second lead frame are bonded to the power feeding lead pins through a ribbon or a wire.

4. The laser light source module according to claim 1, wherein
the first lead frame is substantially U-shaped with a planar main portion and a bent portion arranged at terminal ends of the planar portion.

\* \* \* \* \*